(12) United States Patent
Drowley et al.

(10) Patent No.: US 12,262,557 B2
(45) Date of Patent: Mar. 25, 2025

(54) METHODS AND SYSTEMS TO IMPROVE UNIFORMITY IN POWER FET ARRAYS

(71) Applicant: SEMICONDUCTOR COMPONENTS INDUSTRIES, LLC, Scottsdale, AZ (US)

(72) Inventors: Clifford Drowley, Santa Clara, CA (US); Andrew P. Edwards, Santa Clara, CA (US); Hao Cui, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 476 days.

(21) Appl. No.: 17/707,839

(22) Filed: Mar. 29, 2022

(65) Prior Publication Data

US 2022/0328476 A1 Oct. 13, 2022

Related U.S. Application Data

(60) Provisional application No. 63/172,545, filed on Apr. 8, 2021.

(51) Int. Cl.
| | | |
|---|---|---|
| *H10D 84/83* | (2025.01) | |
| *H10D 30/01* | (2025.01) | |
| *H10D 30/62* | (2025.01) | |
| *H10D 30/67* | (2025.01) | |
| *H10D 64/01* | (2025.01) | |
| *H10D 64/27* | (2025.01) | |
| *H10D 84/05* | (2025.01) | |

(52) U.S. Cl.
CPC ......... *H10D 84/834* (2025.01); *H10D 30/024* (2025.01); *H10D 30/6211* (2025.01); *H10D 30/6219* (2025.01); *H10D 64/01* (2025.01); *H10D 64/512* (2025.01); *H10D 84/05* (2025.01); *H10D 30/6735* (2025.01)

(58) Field of Classification Search
None
See application file for complete search history.

(56) References Cited

U.S. PATENT DOCUMENTS

| | | | | |
|---|---|---|---|---|
| 9,397,099 B1* | 7/2016 | Huang | ............... | H01L 29/6681 |
| 9,905,467 B2* | 2/2018 | Li | ............... | H10D 84/0156 |
| 2015/0206759 A1* | 7/2015 | Tsao | ............... | H01L 21/0273 |
| | | | | 438/424 |
| 2016/0197005 A1* | 7/2016 | Tsao | ............... | H01L 29/6681 |
| | | | | 438/424 |
| 2017/0069504 A1* | 3/2017 | Li | ............... | H10D 84/853 |
| 2017/0170174 A1* | 6/2017 | Chang | ............... | H01L 21/823481 |
| 2019/0326287 A1* | 10/2019 | Liaw | ............... | H01L 27/0924 |

* cited by examiner

*Primary Examiner* — Nishath Yasmeen
(74) *Attorney, Agent, or Firm* — Kevin B. Jackson

(57) ABSTRACT

A vertical, fin-based field effect transistor (FinFET) device includes an array of individual FinFET cells. The array includes a plurality of rows and columns of separated fins. Each of the separated fins is in electrical communication with a source contact. The vertical FinFET device also includes one or more rows of first inactive fins disposed on a first set of sides of the array of individual FinFET cells, one or more columns of second inactive fins disposed on a second set of sides of the array of individual FinFET cells, and a gate region surrounding the individual FinFET cells of the array of individual FinFET cells, the first inactive fins, and the second inactive fins.

12 Claims, 12 Drawing Sheets

METHODS AND SYSTEMS TO IMPROVE UNIFORMITY IN POWER FET ARRAYS

CROSS-REFERENCES TO RELATED APPLICATIONS

This application claims priority to U.S. Provisional Patent Application No. 63/172,545, filed on Apr. 8, 2021, the disclosure of which is hereby incorporated by reference in its entirety for all purposes.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral.

III-nitride materials, and in particular, gallium nitride (GaN), allow vertical FET-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the area of vertical power transistors, there is a need in the art for improved methods and systems related to vertical power transistors.

SUMMARY OF THE INVENTION

The present invention generally relates to the field of electronics, and more specifically to semiconductor manufacturing technology. In a particular embodiment, structures and methods of forming uniform arrays of vertical conducting FETs in a gate-all-around architecture are provided. Embodiments of the present invention are applicable to a variety of different, vertical FET structures and gate configurations.

According to an embodiment of the present invention, a vertical, fin-based field effect transistor (FinFET) device is provided. The vertical FinFET device includes an array of individual FinFET cells. The array includes a plurality of rows and columns of separated fins. Each of the separated fins is in electrical communication with a source contact. The vertical FinFET device also includes one or more rows of first inactive fins disposed on a first set of sides of the array of individual FinFET cells, one or more columns of second inactive fins disposed on a second set of sides of the array of individual FinFET cells, and a gate region surrounding the individual FinFET cells of the array of individual FinFET cells, the first inactive fins, and the second inactive fins.

According to another embodiment of the present invention, a method of fabricating a vertical, fin-based field effect transistor (FinFET) device is provided. The method includes providing a III-nitride substrate including a plurality of epitaxial layers, forming a metal layer coupled to one of the plurality of epitaxial layers, patterning the metal layer to form source contacts, and forming a recess region in one or more of the plurality of epitaxial layers to define an active fin array, inactive fin columns, and one or more inactive fin rows. Each of the source contacts is in electrical communication with an active fin in the active fin array. The method also includes regrowing a gate layer in the recess region, forming a dielectric layer over the source contacts, and forming vias through the dielectric layer. The method further includes forming a source pad metal over the dielectric layer and in the vias, wherein the source pad metal is in electrical communication with the source contacts and forming a drain layer electrically coupled to the III-nitride substrate.

Numerous benefits are achieved by way of the present disclosure over conventional techniques. For example, embodiments of the present disclosure provide methods and systems that provide uniform dimensions in arrays of gate-all-around vertical field effect transistors. These and other embodiments of the disclosure, along with many of its advantages and features, are described in more detail in conjunction with the text below and corresponding figures.

DETAILED DESCRIPTION OF SPECIFIC EMBODIMENTS

Figure 1:
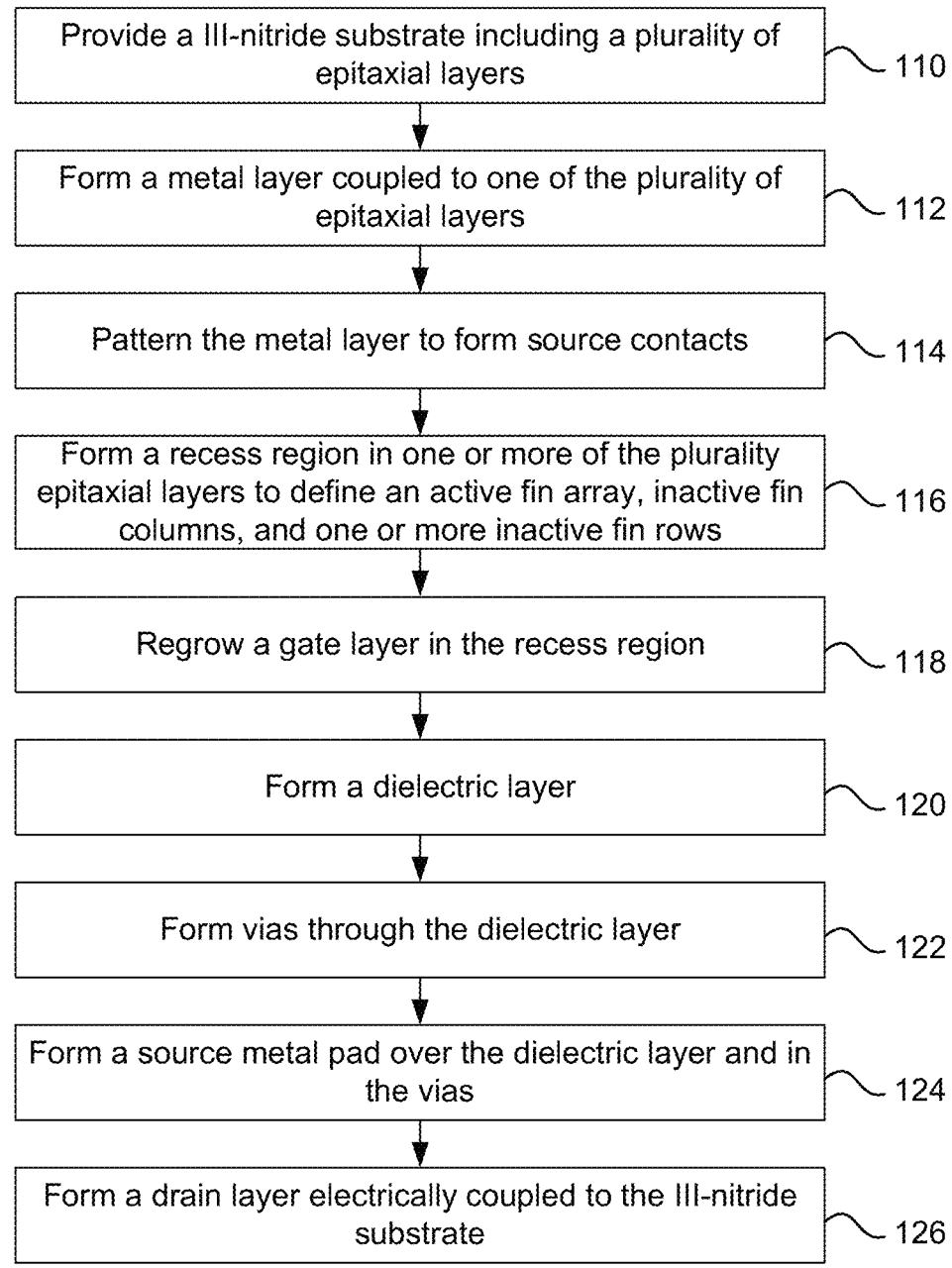
FIG. 1 is a simplified flowchart of a method of fabricating a vertical fin-based JFET using a regrown-gate approach according to an embodiment of the present invention.

The present invention generally relates to the field of electronics, and more specifically to semiconductor manufacturing technology. In a particular embodiment, structures and methods of forming uniform arrays of vertical conducting FETs in a gate-all-around architecture are provided. Embodiments of the present invention are applicable to a variety of different, vertical FET structures and gate configurations.

Power semiconductor devices including transistors and diodes are widely used today in such applications as industrial power supplies, motor drives, consumer electronics, etc.

A common application of power semiconductor transistors is their use as switches in switch-mode power supplies or motor drives. In such applications, the ability of the device to operate at high voltages (650V or 1200V, for example) and to withstand momentary overvoltage conditions (line surges or lightning strikes on power lines, for example) are extremely important.

In addition, in order to reduce the resistance of the switch and reduce parasitic capacitances, etc., that limit switch speed, an increased conductance per unit area is desirable. Switch transistors in which the current flow is primarily vertical offer reduced resistance per area; this benefit can be further improved by arranging the control channel of the transistor to lie in the vertical direction, e.g., a "trench" channel transistor. The resistance of the transistor has several components, including the resistance of the transistor channel (the region where current is directly controlled by the input gate voltage), the resistance of the "drift" region (the region designed to hold the breakdown voltage of the transistor), and the resistance of the starting substrate, contacts, metals, etc.

Transistors with vertical current flow are typically designed with the drain contact at the bottom surface of the chip, and the gate and source contacts at the top surface of the chip.

In order to maximize the switch conductivity (minimize the switch resistance) and provide a uniform transient response for the device, the transistor may be fabricated using an array of many small vertical-channel switch devices surrounded by control gates (an array of "gate-all-around" transistors). The finished device has all sources connected to a single electrode, the surrounding gates connected to a common gate electrode, and a common drain electrode.

Improvements in switch resistance and capacitance can be made by changing the semiconductor material from silicon to a wide bandgap material such as gallium nitride, which offers a higher critical field for breakdown; this allows the high-voltage drift region of the device to be made thinner and more heavily doped than with similar silicon devices, reducing the "specific resistance" (product of resistance and area) of the drift region, and reducing the device on resistance for a given die size.

Accordingly, for such wide bandgap transistors, the gate-all-around array has a small area, and is typically fabricated with fine lithographic features (e.g., minimum geometries of <0.5 μm), particularly for normally off JFETs where the built-in pn-junction depletion is used to turn off the device channel at zero bias. The control of these features is critical to the uniform operation of the device. For example, if the individual device in the gate-all-around array is a vertical JFET or accumulation-mode MOSFET built on a vertical "fin", variations in the width of the fin can cause significant variation in the individual device leakage or threshold voltage. Such variations impact the overall leakage of the array or the on-resistance of the array, and can affect the maximum voltage or switching efficiency of the device.

Accordingly, embodiments of the present invention provide methods and systems that provide uniform dimensions in arrays of gate-all-around vertical transistors.

A vertical FET transistor structure is described in U.S. Pat. No. 9,117,839 (Kizilyalli, et al.) (the "839 structure"), the disclosure of which is hereby incorporated by reference in its entirety for all purposes. In the '839 structure, the transistor conducting channel is formed using a semiconductor "fin" created by patterning and etching surrounding material to a certain depth. A semiconductor material with an opposite doping type is epitaxially regrown (e.g., using metalorganic vapor phase epitaxy, or MOVPE) to be substantially planar to the top of the semiconductor "fin". The regrown material serves as the gate electrode of a vertical FET, and application of control voltages to the gate electrode modulates the conduction of current in the vertical "fin" channel between the top of the fin ("source") and bottom of the fin (normally, the drift region which is further connected to the "drain" electrode via the semiconductor substrate).

In the '839 structure, the regrown gate material surrounds the fin. An array of fins can be fabricated with a common gate using this approach, with (for example) fins arranged in a number of rows and columns so that the total number of transistors achieves the desired on-resistance target for the final device.

Dimensional control of the fins is utilized to maintain uniform device characteristics for each individual fin. Fin width control is particularly useful to achieve a narrow threshold voltage and leakage current distribution. Accordingly, embodiments of the present invention provide methods and systems to achieve the local uniformity of the lithography process that creates the masking layer that defines the fin geometry. The local uniformity of the etch processes that transfer the masking layer pattern into the hard mask and the GaN to create the fin structures is also provided by embodiments of the present invention.

The inventors have determined that the uniformity of both the lithography process and the etch processes can vary significantly between a region with a regular pattern and a region with a sparse pattern. Such a transition occurs at the edges of the array of fins. For example, the presence of a large sparse area next to a regular array can lead to differences in exposure dose due to proximity effects, which will cause the resist linewidth to vary between the center of the array and the edges of the array, with a resulting increase in the electrical variation of the fin devices near the edge of the array. For example, the presence of a large sparse pattern area next to a regular pattern array can lead to differences in etch rate caused by variation in the amount of etchant consumed in the sparse pattern region vs. the amount consumed in the regular pattern array. Such differences in etch rate can affect both fin width and fin thickness, with a resulting increase in the electrical variation of the fin devices near the edge of the array.

In addition, the inventors have determined that the uniformity of the regrown-gate process may be dependent on the local pattern density in the array as discussed in U.S. patent application Ser. No. 17/135,436, the disclosure of which is hereby incorporated by reference in its entirety for all purposes. The regrown-gate process in the '839 patent uses a selective area regrowth, where the tops of the fins are protected by a growth mask. GaN does not grow on the mask, and the gallium-containing species that arrive on the mask diffuse to the exposed GaN surrounding the mask, thereby enhancing the epitaxial growth rate in the array relative to the growth rate on a uniform GaN surface such as is found outside the array. Such variations in the growth rate can lead to non-uniform thickness of growth on the fin sidewalls (which will affect the effective channel length of the switch, and can cause variation in leakage current at high voltage and in threshold voltage) for fins near the edges of the array. Variation in the growth rate may also affect the uniformity of dopant incorporation in the GaN during regrowth, which in turn can cause variation in threshold voltage.

Similarly, the local incorporation rate of dopant species in the regrown gate (or through the use of a gas-phase doping technique, e.g., as described in U.S. Provisional Patent Application No. 63/148,024, the disclosure of which is hereby incorporated by reference in its entirety for all purposes), can be affected by the presence of a local mask or local topography. Doping of the regrown gate using a Mg-containing species (e.g., Cp2Mg) can vary near the edge of the array, causing local variations in threshold voltage or leakage characteristics of the vertical devices in that region.

Therefore, embodiments of the present invention provide methods and structures that can improve uniformity of lithography control, etch control, and regrowth control (if used) to ensure uniform device characteristics for the individual vertical fin-based transistors in the array.

As described more fully herein, in some embodiments, an array of fins is created in a second epitaxial layer disposed on a first epitaxial layer on a substrate, to form a vertical power device, as described, for example, in U.S. patent application Ser. No. 16/929,926 and U.S. Provisional Patent Application No. 63/051,979, the disclosures of which are hereby incorporated by reference in their entirety for all purposes. The array is arranged in a regular pattern of rows and columns. For the discussion below, the fins are assumed to be rectangular in plan view, with the long axis arranged in the direction of the column (the y-direction) and the narrow axis arranged in the direction of the row (the x-direction). Various other arrangements of the fin array are possible, for example, as discussed in U.S. patent application Ser. No. 17/135,436, the disclosure of which is hereby incorporated by reference in its entirety for all purposes. In an embodiment, the conductivity type of the first and second epitaxial layers and the substrate are n-type.

According to embodiments of the present invention, the array is designed to include extra fins, also referred to as inactive fins, at the ends of each row, and an at least one extra fin at the top and bottom of each column, thereby providing an excess number of fins compared to the number of fins utilized to achieve the desired on-resistance and current capacity for the transistor array. In some embodiments, the number of extra fins at each end of a row is between one and ten. In an embodiment, the number of extra fins at each end of a row is five. In an embodiment, the extra fin at the top and bottom of each column is shorter in the y-direction than the other fins in the column.

The methods provided according to the present invention can also include forming a gate region around the fins using one of several methods. Forming the gate region can include regrowing an epitaxial layer in the region between the fins, as described in U.S. patent application Ser. No. 16/929,926 and U.S. Provisional Patent Application No. 63/051,979. In some embodiments, this epitaxial layer is p-GaN. Forming the gate region can include implanting a gate region in the region between the fins (and optionally, in the sidewalls of the fins), where the conductivity type of the gate region is opposite that of the first and second epitaxial layers. In an embodiment, the gate region is p-type. These implantation methods are discussed in U.S. Provisional Patent Application Nos. 63/040,853, 63/044,693, and 63/148,024, the disclosures of which are hereby incorporated by reference in their entirety for all purposes. Forming the gate region can further include diffusing a gate region in the region between the fins (and optionally, in the sidewalls of the fins), where the conductivity type of the gate region is opposite that of the first and second epitaxial layers. In an embodiment, the gate region is p-type. In an embodiment, the dopant is diffused from a solid source. In an embodiment, the dopant is diffused from a gas-phase source. In an embodiment, the dopant is one of Mg, Zn or Be. These diffusion methods are discussed in U.S. Provisional Patent Application Nos. 63/040,853, 63/044,693, and 63/148,024, the disclosures of which are hereby incorporated by reference in their entirety for all purposes.

The methods described herein can also include forming a dielectric layer on the surfaces of the trench, and forming a metal gate electrode on the dielectric layer. The work function of the metal is such that the metal gate electrode depletes the fin at zero bias as described in U.S. Patent Application No. 63/044,693, the disclosure of which is hereby incorporated by reference in its entirety for all purposes. After forming the gate region, the methods can include forming a source metal contact to the tops of the fins. In an embodiment, this source metal contact is formed on all of the fins. In an embodiment, this source metal contact is not formed on the "extra" fins. After forming the gate region, the methods can include forming a junction terminated edge (JTE) region, for example, as described in U.S. Patent Provisional Application Nos. 63/049,562 and 63/142,909, the disclosures of which are hereby incorporated by reference in their entirety for all purposes. After forming the JTE region, the methods can include forming a gate metal contact to the gate region and after forming the gate metal contact, depositing an interlayer dielectric. The interlayer dielectric can be patterned and etched to form through-holes to the source metal contact. In an embodiment, the through-holes are not formed on the "extra" fins. The methods can also include forming through-holes to the gate metal contact in a region away from the array of fins. The methods can include depositing a pad metal layer that extends through the through holes, and patterning the pad metal layer so that one region (the source pad) connects all of the source metal contacts, and one region (the gate pad) connects to the gate metal contact.

Utilizing embodiments of the present invention, a structure is created in which the array of active device fins is separated from the sparsely patterned region outside the array by a buffer region of extra fins. The extra fins are not connected to the source electrode, and so do not contribute to the current-carrying capability of the transistor array. The buffer region is sized such that the non-uniformities due to the proximity of the sparsely patterned region are reduced or minimized in the array of active devices.

In an alternative embodiment, a mask pattern can be created for an array of fins. The size of the mask pattern can be locally biased, using a spatially dependent algorithm, to adjust the size of the fins near the edge of the array to compensate for variations in lithography, etching and epitaxial regrowth caused by the transition from the array to the region outside the array. Patterning of the fins using the biased mask pattern can create the vertical transistors as described herein.

Embodiments of the present invention are applicable to arrays of fin-based vertical FETs in which the current runs vertically along the fin and the arrays of fins are enclosed by a gate-all-around structure so that all fins have a common gate. The gate-channel interface can be located on the vertical sidewall of the vertical fin. The FETs may be JFETs with regrown gates, implanted gates, or diffused gates, or they may be MOSFETs, including accumulation-mode MOSFETs. The fin-based vertical FETs can be fabricated using III-nitride semiconductors. In an embodiment, the fin-based vertical FETs are fabricated using GaN. In an embodiment, the number of inactive fin columns is between 1 and 10, and the number of inactive fin rows is between 1 and 5. In an embodiment, the inactive fin rows use fins of shorter height (as discussed in relation to FIG. 4B) than the active rows of the active array. In an embodiment, the inactive fin row height is comparable to the width of the region encompassed by the inactive fin columns.

FIG. 1 is a simplified flowchart of a method of fabricating a vertical fin-based JFET using a regrown-gate approach according to an embodiment of the present invention. Further details related to the fabrication process are provided in U.S. Patent Application Publication Nos. 2021/0028312, and 2022/0020743, the disclosures of which are hereby incorporated by reference in their entirety for all purposes. Referring to FIG. 1, the method 100 of fabricating a vertical fin-based JFET using a regrown-gate approach includes providing a III-nitride substrate including a plurality of epitaxial layers (110). In an embodiment, the III-nitride substrate is an n-type GaN substrate having a resistivity in a range of about 0.020 ohm-cm. In one embodiment, the resistivity of the n-type GaN substrate may be from about 0.001 ohm-cm to 0.018 ohm-cm, preferably less than 0.016 ohm-cm, and more preferably, less than 0.012 ohm-cm. The plurality of epitaxial layers can include a first III-nitride epitaxial layer, a second III-nitride epitaxial layer formed on the first III-nitride epitaxial layer, and a third III-nitride epitaxial layer formed on the second III-nitride epitaxial layer.

In some embodiments, the first III-nitride epitaxial layer is an n-type GaN epitaxial layer that is ~12 μm thick that is deposited on the III-nitride substrate. The first III-nitride epitaxial layer can be epitaxially grown on the III-nitride substrate at a temperature between 950 and 1100° C. and can be characterized by a first dopant concentration, e.g., n-type doping with a dopant concentration of about $1\times10^{16}$ atoms/cm$^3$. In some embodiments, the first III-nitride epitaxial layer serves as a drift layer for the fin-based JFET and includes a uniformly doped region (layer) on the III-nitride substrate and a graded doping region (layer) on the uniformly doped region. In an embodiment, the uniformly doped region has a thickness of about 12 μm, and the graded doping region has a thickness of about 0.3 micron. In an embodiment, the surface of substrate is miscut from the c-plane at an angle to facilitate high-quality epitaxial growth for high-voltage operation of the drift layer.

The second III-nitride epitaxial layer can be a III-nitride epitaxial layer with a thickness of about 0.7 μm and can be characterized by a second dopant concentration, e.g., n-type doping. The second dopant concentration is higher than the first dopant concentration in some embodiments. In an embodiment, the second dopant concentration is about $1.3\times10^{17}$ atoms/cm$^3$. The third III-nitride epitaxial layer can be a heavily doped III-nitride layer suitable for use in forming the source of the fin-based JFET.

Method 100 further includes forming a metal layer coupled to one of the plurality of epitaxial layers (112), forming a hard mask material on the third III-nitride epitaxial layer, patterning the hard mask material to form a patterned hard mask, and patterning the metal layer to form source contacts (114). The hard mask material may include multiple layers. Method 100 further includes forming a recess region in the second III-nitride epitaxial layer using the patterned metal layer, for example, by an etch process, e.g., a reactive ion etching (ME) process (116). The remaining portion of the second III-nitride epitaxial layer and the third III-nitride epitaxial layer between the recess region defines the active fins in the active fin array of the fin-based JFET device and the inactive fins in the inactive fin columns and the one or more inactive fin rows. The method 100 further includes regrowing a III-nitride epitaxial layer (e.g., a fourth III-nitride epitaxial layer) in the recess region (118).

The regrown III-nitride epitaxial layer may form a gate layer of the fin-based JFET device. In one embodiment, the regrown III-nitride epitaxial layer has a conductivity type opposite the conductivity type of the first, second, and third III-nitride epitaxial layers.

Method 100 further includes forming a dielectric layer (120), forming vias through the dielectric layer (122), forming a source metal pad over the dielectric layer and in the vias (124), and forming a drain layer electrically coupled to the III-nitride substrate (126). The source contact can be formed using a source metal that is deposited on the third III-nitride layer before fin formation or on the fins after fin definition performed in relation to the formation of the recess regions. The gate contact can be a patterned structure that is formed on the regrown III-nitride epitaxial layer. The drain contact can be deposited on the opposing side of the substrate with respect to the source contact and the drain contact.

It should be appreciated that the specific steps illustrated in FIG. 1 provide a particular method of fabricating a vertical fin-based JFET device with a regrown gate layer according to an embodiment of the present invention. Other sequences of steps may also be performed according to alternative embodiments. For example, alternative embodiments of the present invention may perform the steps outlined above in a different order. Moreover, the individual steps illustrated in FIG. 1 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 2A:
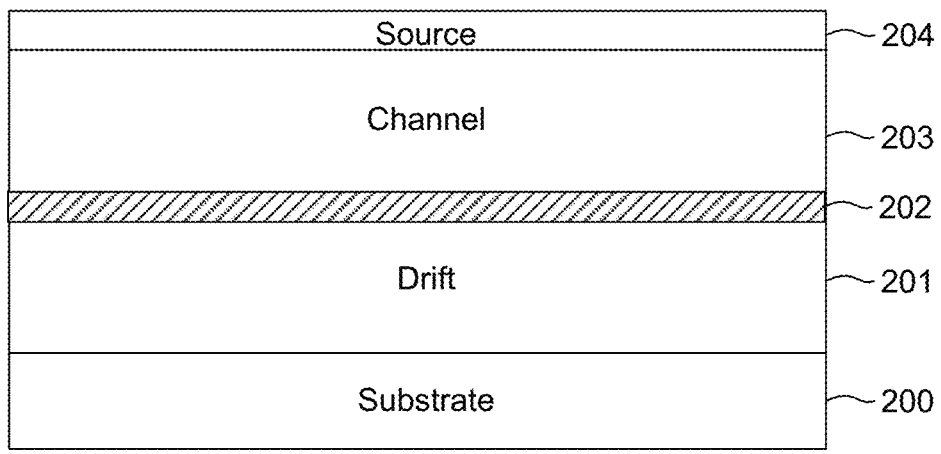
FIGS. 2A through 2D are cross-sectional views showing intermediate stages of a method of fabricating a vertical fin-based JFET device according to an embodiment of the present invention.

FIGS. 2A through 2D are cross-sectional views showing intermediate stages of a method of fabricating a vertical fin-based JFET device according to an embodiment of the present invention. Referring once again to FIG. 1 and with reference to FIGS. 2A through 2D, the method of fabricating a vertical fin-based JFET device is described in relation to a cross-section through an array of fin-based JFETs. Referring to FIG. 2A, an n-type III-nitride substrate 200 is provided. The n-type III-nitride substrate 200 can be heavily doped with n-type dopants in a dopant concentration in a range of about $5\times10^{17}$ atoms/cm$^3$ to about $1\times10^{19}$ atoms/cm$^3$ and a resistivity of less than 0.020 ohm-cm. In one embodiment, the resistivity of the n-type III-nitride substrate 200 may be from about 0.001 ohm-cm to 0.018 ohm-cm, preferably less than 0.016 ohm-cm, and more preferably, less than 0.012 ohm-cm.

In this embodiment, a first n-type semiconductor layer 201, which will serve as a drift layer, is epitaxially grown on n-type III-nitride substrate 200 at a temperature between 950 and 1200° C., preferably between 1000 and 1150° C., and more preferably about 1100° C. The first n-type semiconductor layer 201 can have a thickness of about 12 μm and a dopant concentration in a range of about $1\times10^{16}$ atoms/cm$^3$. In some embodiments, a graded doping region 202 having a thickness of about 0.3 μm is disposed between the first n-type semiconductor layer 201 and the second n-type semiconductor layer 203 and has a dopant concentration that increases (e.g., linearly) from about $1\times10^{16}$ atoms/cm$^3$ to $1.3\times10^{17}$ atoms/cm$^3$, i.e., from the first n-type semiconductor layer toward the second n-type semiconductor layer.

A second n-type semiconductor layer 203, which will serve as the channel layer, is epitaxially grown on graded doping region 202, or on first n-type semiconductor layer 201 in embodiments in which graded doping region 202 is optional, at a temperature between 950 and 1200° C., preferably between 1000 and 1150° C., and more preferably about 1100° C. As described more fully herein, the second n-type semiconductor layer 203 will form a fin conduction layer and can be a uniformly doped region with n-type dopants of about $1.3 \times 10^{17}$ atoms/cm$^3$ and a thickness of about 0.8 μm. A third III-nitride semiconductor layer 204, which may form the source, is formed on second n-type semiconductor layer 203. The third III-nitride semiconductor layer 204 may be a heavily doped n-type layer that serves to improve the contact resistance between the second n-type semiconductor layer 203 and the metal layer 205, which then serves as the source contact.

Figure 2B:
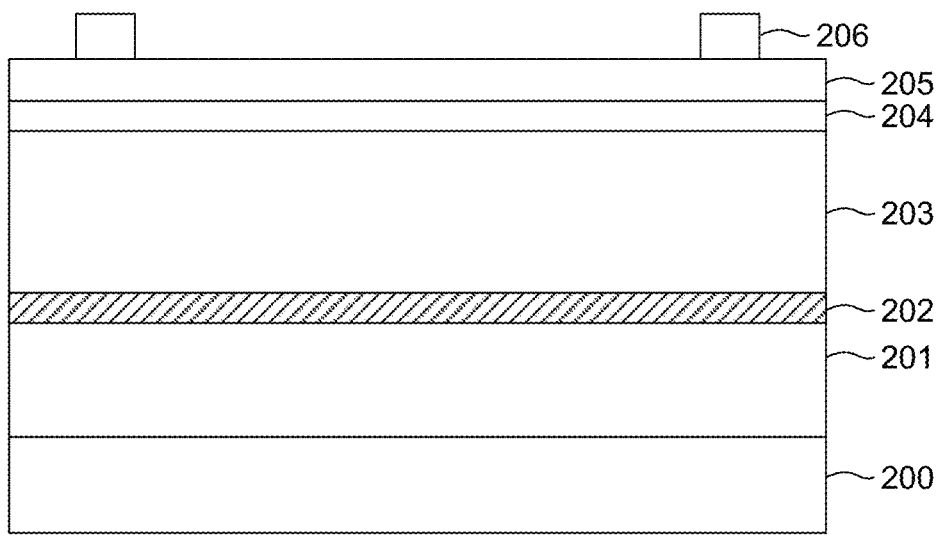

Referring to FIG. 2B, a metal layer 205 is deposited on third III-nitride semiconductor layer 204 and a patterned hard mask 206 is formed on metal layer 205. In an embodiment, the metal layer 205 may include TiN and the patterned hard mask can be formed from a layer that includes silicon nitride e.g., $Si_3N_4$, with a thickness of about 400 nm. The $Si_3N_4$ layer can be formed by PECVD at about 300° C. In an embodiment, patterned hard mask 206 may be formed using RIE with F-based chemistry. In an embodiment, metal layer 205 is omitted.

Figure 2C:
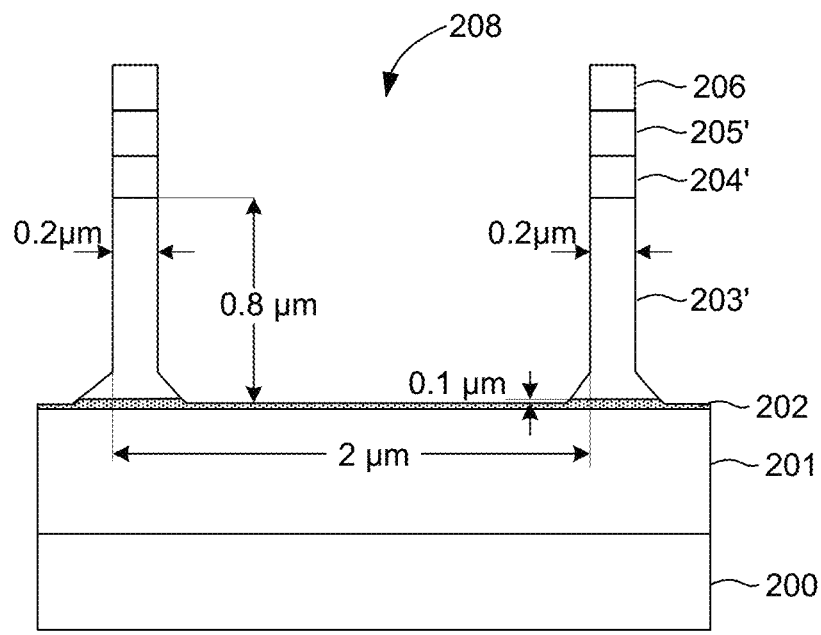

Referring to FIG. 2C, an etch process is performed using the patterned hard mask 206 as a mask to form a plurality of fins 203', sources 204', and source contacts 205'. In some embodiments, the fins 203' each have a width of about 0.2 μm, and a thickness in a range between about 0.7 μm and 0.8 μm, and are spaced apart from each other by a space of about 2 μm, i.e., the fin pitch is about 2 μm. To have a uniform thickness for the fins, good controllability of the depth of the etch process is utilized. In accordance with the present disclosure, an etch process may include Cl-based chemistry using RIE and is carried out to remove a portion of second n-type semiconductor layer 203 to form a recess region 208. In an embodiment, the etch process may stop when about 0.1 μm of graded doping region 202 is removed. The graded doping region 202 is utilized in some embodiments to mitigate the electrical effects of the etch process variation or tolerance.

It is noted that the bottom portion of the fins may have a shape different from the shape shown in FIG. 2C after the etch process. Embodiments of the present disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the following drawings, the bottom portions of the fins are shown as having a 90 degrees angle with the surface of the graded doping region, i.e., the fins are shown as having a cross-sectional rectangular shape. It is understood that the bottom portions of the fins may have rounded or curved features. Thus, the regions illustrated in the figures are schematic in nature and their shapes are not intended to illustrate the actual shape of a region of a device and are not intended to limit the scope of the invention.

In one embodiment, after forming the trench, a cleaning process is carried using a tetramethylammonium hydroxide (TMAH) solution of about 25% by weight, at a temperature of about 85° C., and for a duration of about 30 minutes. In another embodiment, prior to performing a cleaning using the TMAH solution, a pre-cleaning such as piranha clean using $H_2SO_4:H_2O$ in a volume ratio 2:1 for 2 minutes may also be performed.

Figure 2D:
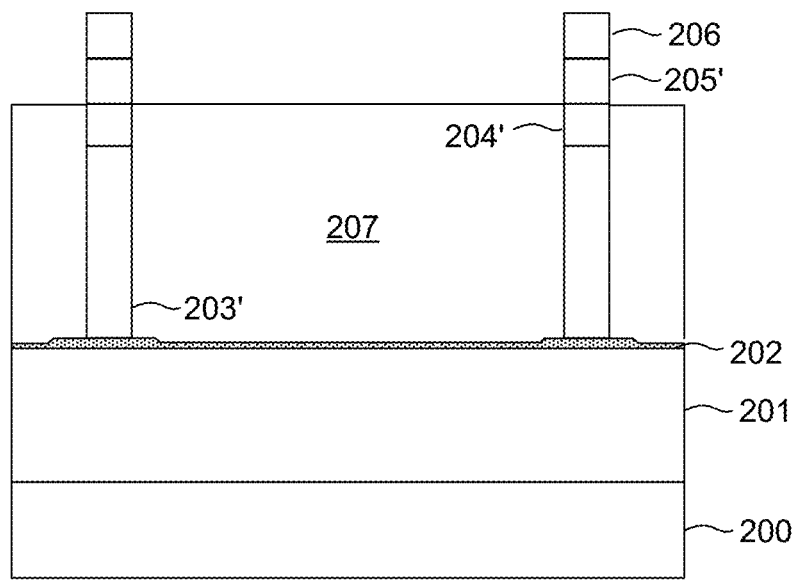

Referring to FIG. 2D, after the cleaning, a fourth semiconductor layer 207 is epitaxially grown in recess region 208. In an embodiment, fourth semiconductor layer 207 may include a p-type GaN layer that is grown non-conformally in the trench at a temperature of about 950° C. up to a thickness that is substantially planar to the bottom of source contacts 205'. In one embodiment, the thickness of fourth semiconductor layer 207 is about 1,000 nm. Accordingly, in some embodiments, the regrowth is substantially planar with the bottom of the patterned growth mask, that is, above sources 204'. The thickness of the regrowth can take in account the thickness of second n-type semiconductor layer 203, the etch into the graded doping region 202, and the thickness of third III-nitride semiconductor layer 204. The target deposition thickness on an unpatterned wafer is thinner due to the growth rate enhancement from the hardmask regions in the device area. The p-type GaN layer may be doped with Mg with a dopant concentration of about $1 \times 10^{19}$ atoms/cm$^3$. The p-type GaN layer may be doped with Mg with a dopant concentration of about $1 \times 10^{19}$ atoms/cm$^3$. Thereafter, a thermal anneal (e.g., a rapid thermal annealing in $N_2$ at 850° C. for 5 minutes) is performed to activate the Mg dopant atoms. The Mg atoms are then activated in the p-type GaN layer in an amount of greater than 10% by weight. As illustrated in FIGS. 2C and 2D, sources 204' are formed from the heavily doped n-type layer present between fins 203' and source contacts 205' to improve contact resistance between the second N-type semiconductor layer and the metal layer.

Figure 3:
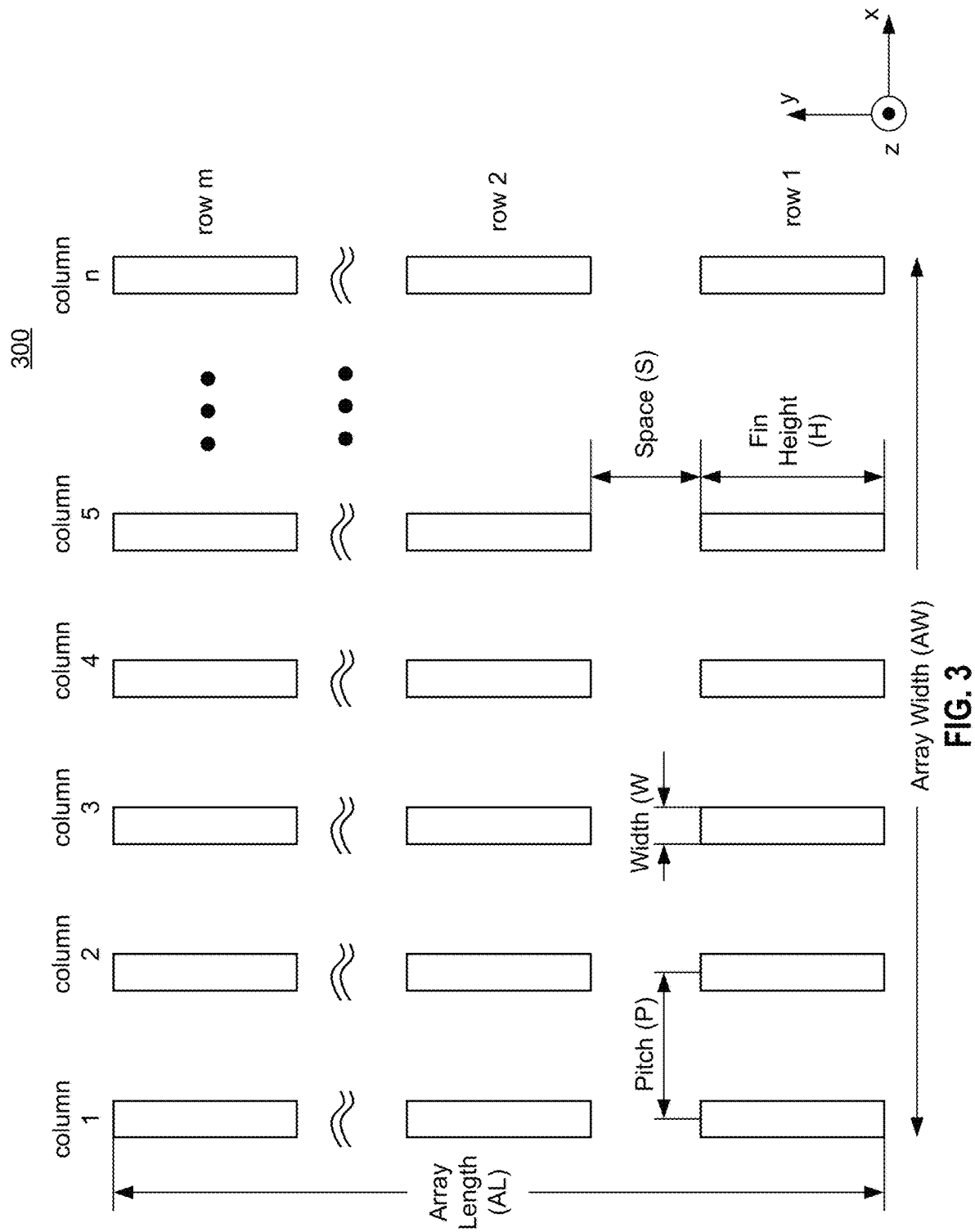
FIG. 3 is a plan view of a fin pattern layout illustrating a fin array 300 having a plurality of semiconductor fins having predetermined fin heights according to an embodiment of the present disclosure.

FIG. 3 is a plan view of a fin pattern layout illustrating a fin array 300 having a plurality of semiconductor fins having fins of predetermined height according to an embodiment of the present disclosure. In this plan view, the gate metal is not shown. Additional description related to fin arrays is provided in U.S. Patent Application Publication No. 2021/0210624, the disclosure of which is hereby incorporated by reference in its entirety for all purposes.

Fins used in embodiments of the present invention can be bar-shaped fins having a fin height smaller than 100 μm, e.g., 50 μm, 25 μm, or the like. In other words, a fin can be formed by breaking up a long fin into multiple small fin segments. For example, a fin of 1,000 μm height can be divided into 40 fins, each having a ~25 μm height. Referring to FIG. 3, fin array 300 includes a plurality of fins arranged in a plurality of rows (row 1, row 2, row m) and in a plurality of columns (column 1, column, 2, . . . , column n). The fins in each row are separated from each other by a pitch P. Each row is separated from each other by a space S (i.e., the gap between each row). The total height of the array (AH) is now related to the individual fin height H, the number of rows N, and the space S by AH=N*H+(N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 3, six fins are used in each row (three rows and six columns are shown), but it is understood that the number of fins and the number of rows and columns are arbitrarily chosen for describing the example embodiment and should not be limiting.

In one exemplary embodiment, the fin height H measured along the y-axis is about 25 μm, the fin width W measured along the x-axis is about 0.2 µm, the fin thickness measured along the z-direction is about 0.8 µm, and the pitch P is in the range between 1.5 µm and 2.5 µm. In one embodiment, a ratio between a fin width W and a pitch P between two adjacent fins is in the range between about 0.08 and 0.15, preferably in the range between 0.1 and 0.12. In one embodiment, a ratio between a fin height H and the pitch P between two adjacent fins is in the range between 5 and 25, preferably between 10 and 20, and more preferably between 12 and 16. In one embodiment, the fin height H is about 25 µm and the fin width W is in the range between 0.15 µm and 0.7 µm.

In operation, the fins will form the channels of the FinFET and the gate metal will be deposited between adjacent fins. As a result, the design illustrated in FIG. 3 can be referred to as a "gate-all-around" design in which the gate surrounds the fins.

Figure 4A:
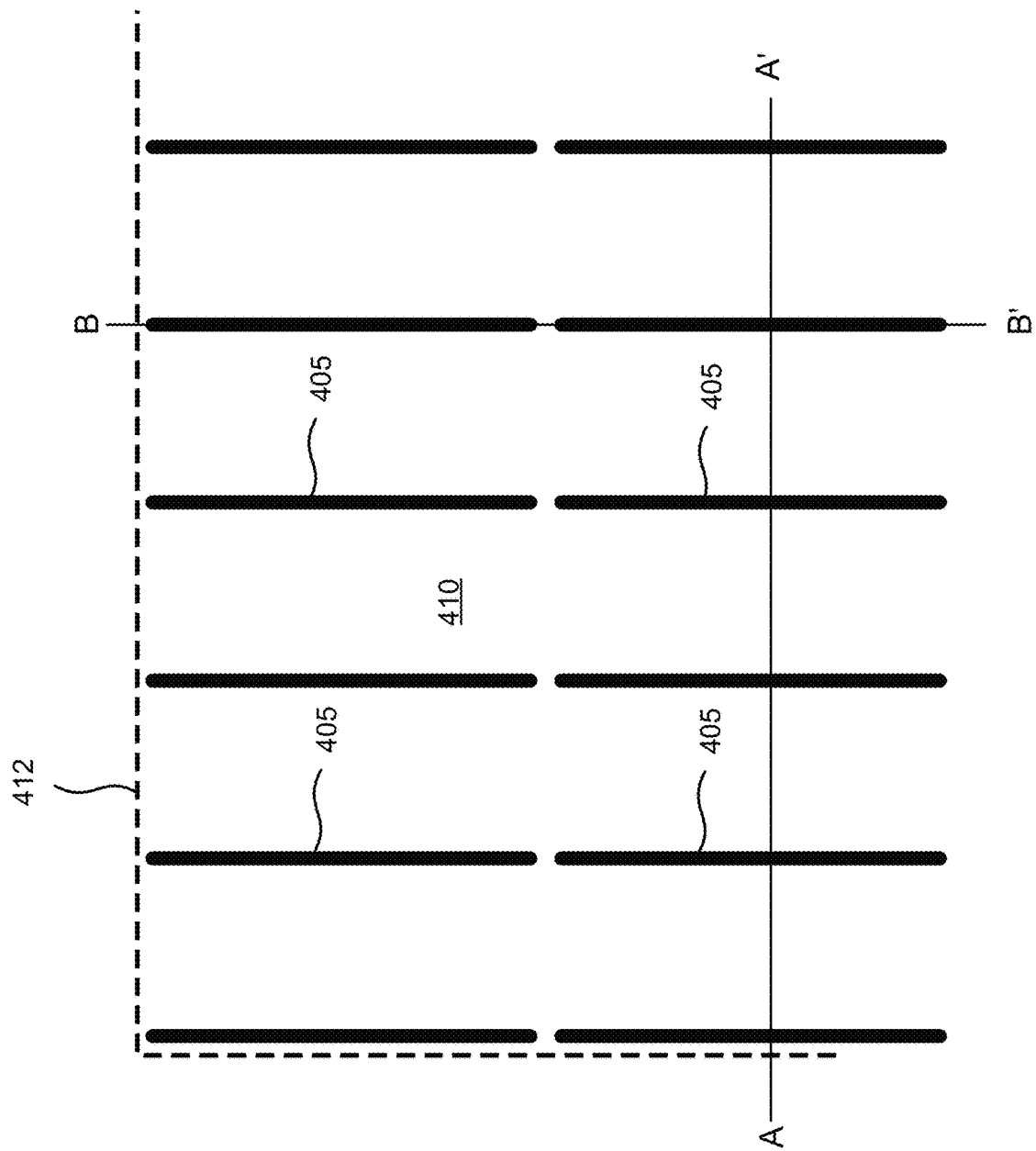
FIGS. 4A and 4B show examples of a plan-view layout of an array of fins without and with inactive fins, respectively, according to an embodiment of the present invention.
Figure 4B:
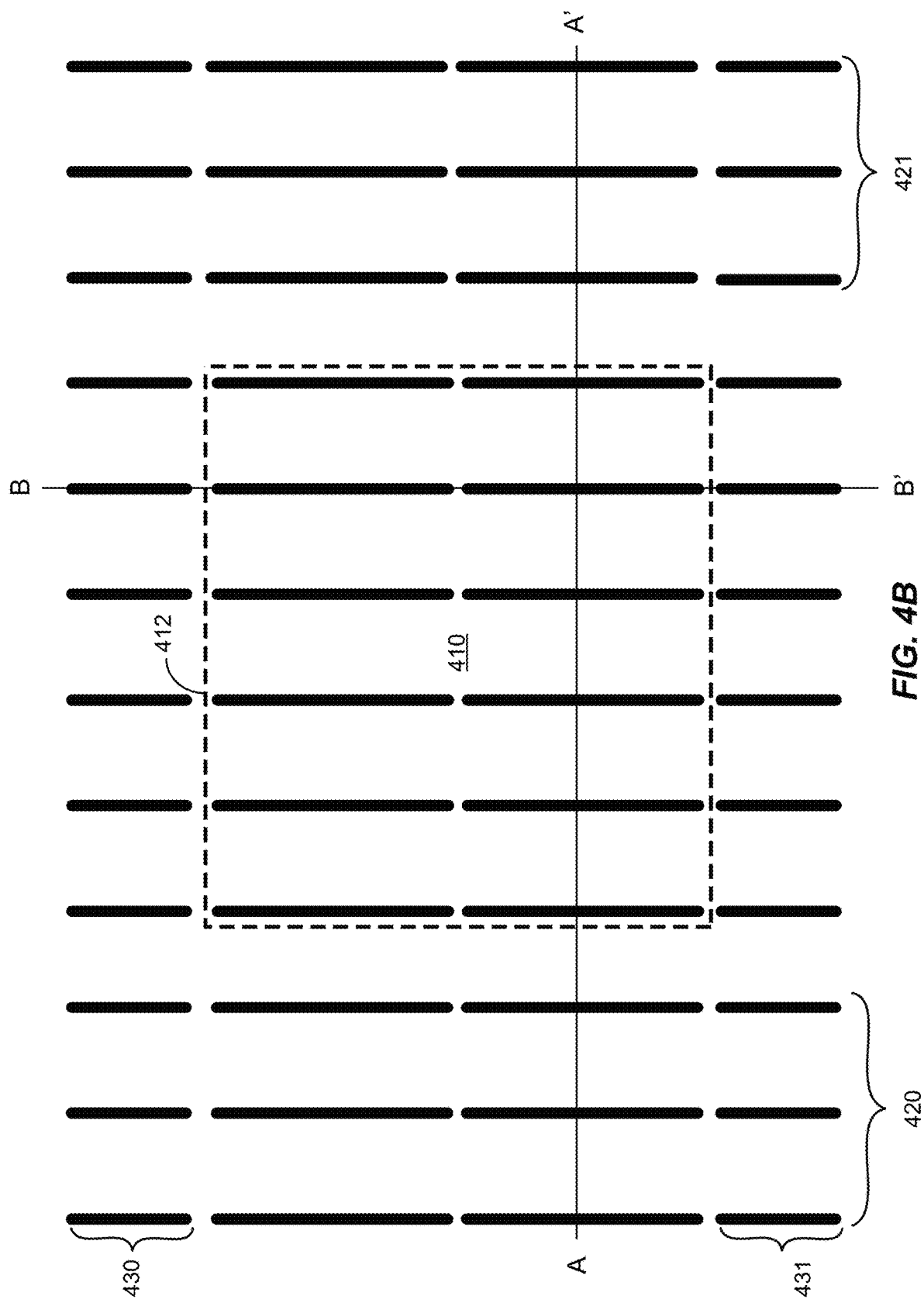

FIGS. 4A and 4B show examples of a plan-view layout of an array of fins without and with inactive fins, respectively, according to an embodiment of the present invention. In FIG. 4A, an active fin array 410 is illustrated. The boundary 412 of the active fin array 410 is also illustrated. The active fin array 410 includes a plurality of fins 405 arranged in a two dimensional array. For purposes of clarity, only two rows of fins, each including six fins, are illustrated, but it will be appreciated that the array dimensions are not limited to this example.

As described above and more fully in relation to FIGS. 4A and 4B, the inventors have found that the local uniformity of the growth (e.g., the uniformity of the thickness of the regrowth between fins from gate region to gate region) is impacted by edge effects present at the boundary 412 of the active fin array 410. Accordingly, embodiments of the present invention improve regrowth uniformity and enable the fabrication of an active fin array with uniform gate regrowth. Achieving uniform gate regrowth enables minimum variation in channel length (i.e., the length of the channel extending along the z-direction aligned with the thickness of the fins in the fin array across a large area). In some embodiments, the fin array can extend more than one millimeter in the x-direction and/or the y-direction, and use of the methods and structures described herein can result in regrowth non-uniformity of <2% of the nominal regrowth thickness, i.e., a variation in regrowth thickness of <15 nm for fins of nominal thickness of 0.75 µm.

In addition to regrowth thickness uniformity, improvements in fin width uniformity are provided by embodiments of the present invention. At the boundary 412 of the active fin array 410, the amount of photoresist developer outside the active fin array is different than the amount of photoresist developer inside the active fin array, resulting in a gradient of developer across the active fin array 410. In conditions in which the developer concentration is lower inside the active fin array in comparison with outside the active fin array, the linewidth of the fin definition mask, e.g., the patterned hard mask or patterned metal mask, can vary. This will result, during the fin definition process, in differences in the fin critical dimension (CD) near the edges of the active fin array compared to the center of the active fin array. Moreover, the etch process can be impacted by edge effects. During etching of the gate trench, a large area outside the active fin array is etched in comparison to a smaller area inside the active fin array. As a result, the etch loading will vary near the edges of the active fin array, resulting in variations in the etch rate and, as a result, variation in the depth of the gate trench across the active fin array. Variation in the depth of the gate trench can then result in variation in the uniformity of the thickness of the regrown material disposed between fins.

Referring to FIG. 4B, the addition of one or more inactive fin columns 420 on a first side of active fin array 410 as well as one or more inactive fin columns 421 on a second side of active fin array 410 opposing the first side and one or more inactive fin rows 430 on a third side of active fin array 410 and one or more inactive fin rows 431 on a fourth side of active fin array 410 opposing the third side result in an increase in regrowth uniformity, active fin CD, and uniform gate trench etch depth in the active fin array 410. The regrowth uniformity enabled by embodiments of the present invention mitigates a number of adverse consequences that would otherwise result from regrowth non-uniformity. These adverse consequences can include: the gate metal layer having different thicknesses for different gates, which causes the metal gate resistivity to vary; unequal channel lengths that cause a high concentration of the current on the short regrown gate area (e.g., a hot spot) that may exceed the maximum permissible temperature value and reduce the device reliability; uneven topography for self-aligned contacts; and higher leakage current.

Referring to FIG. 4B, an array of fins with both an active fin array 410, which will typically have many more active fins than illustrated, and inactive fins is illustrated. In FIG. 4B, the inactive fins, which can also be referred to as dummy fins, are arranged in multiple columns to the left (inactive fin columns 420) and right (inactive fin columns 421) of the active fin array 410 and in one row to the top (inactive fin row 430) and bottom (inactive fin row 431) of the active fin array 410. In FIG. 4B, three inactive fins make up inactive fin column 420, three inactive fins make up inactive fin column 421, one row of inactive fins make up inactive fin row 430, and one row of inactive fins make up inactive fin row 431, but the number of inactive fin columns and inactive fin rows can be greater than the number illustrated in FIG. 4B. Similarly, the number of rows and columns of active fins in the active fin array 410 can also be greater than illustrated. As described more fully in relation to FIG. 9, the inactive fins in the inactive fin columns 420/421 and the inactive fin rows 430/431 do not include source contacts and do not participate in the current flow occurring in the active fin array 410 during operation. However, the inactive fins result in improvements in regrowth uniformity that lead to improved device performance of the FinFETs in the active fin array 410.

Although the inactive fins in the inactive fin columns 420/421 have the same fin width and fin pitch as the active fins in the active fin array 410, this is not required by the present invention and the fin width and the fin pitch in the inactive fin columns 420/421 can differ from that in the active fin array 410. As an example, the pitch of the inactive fins in the inactive fin columns 420/421 could not only be different than the pitch in the active fin array 410, but the pitch could vary across the inactive fin columns 420/421. Additionally, the inactive fins in the inactive fin columns 420/421 can have different fin heights than the active fins in the active fin array 410. Moreover, the inactive fins in the inactive fin row 430/431, although they are illustrated as having the same fin width and fin pitch as the active fins in the active fin array 410, do not have to have the same fin width and the fin pitch as the active fins in the active fin array 410. Additionally, the inactive fins in the inactive fin row 430/431 can be offset along the x-direction with respect to the active fins in the active fin array 410, providing a variation on the embodiment illustrated in FIG. 4B, in which the inactive fins are aligned with the active fins. One of ordinary skill in the art would recognize many variations, modifications, and alternatives.

Irregular edges (e.g., fitting the array to a circular arc of an edge termination) may be accommodated by, for example, "stair-stepping" the active fin array boundary with appropriate combinations of additional rows of inactive fins and additional columns of inactive fins.

Figure 5:
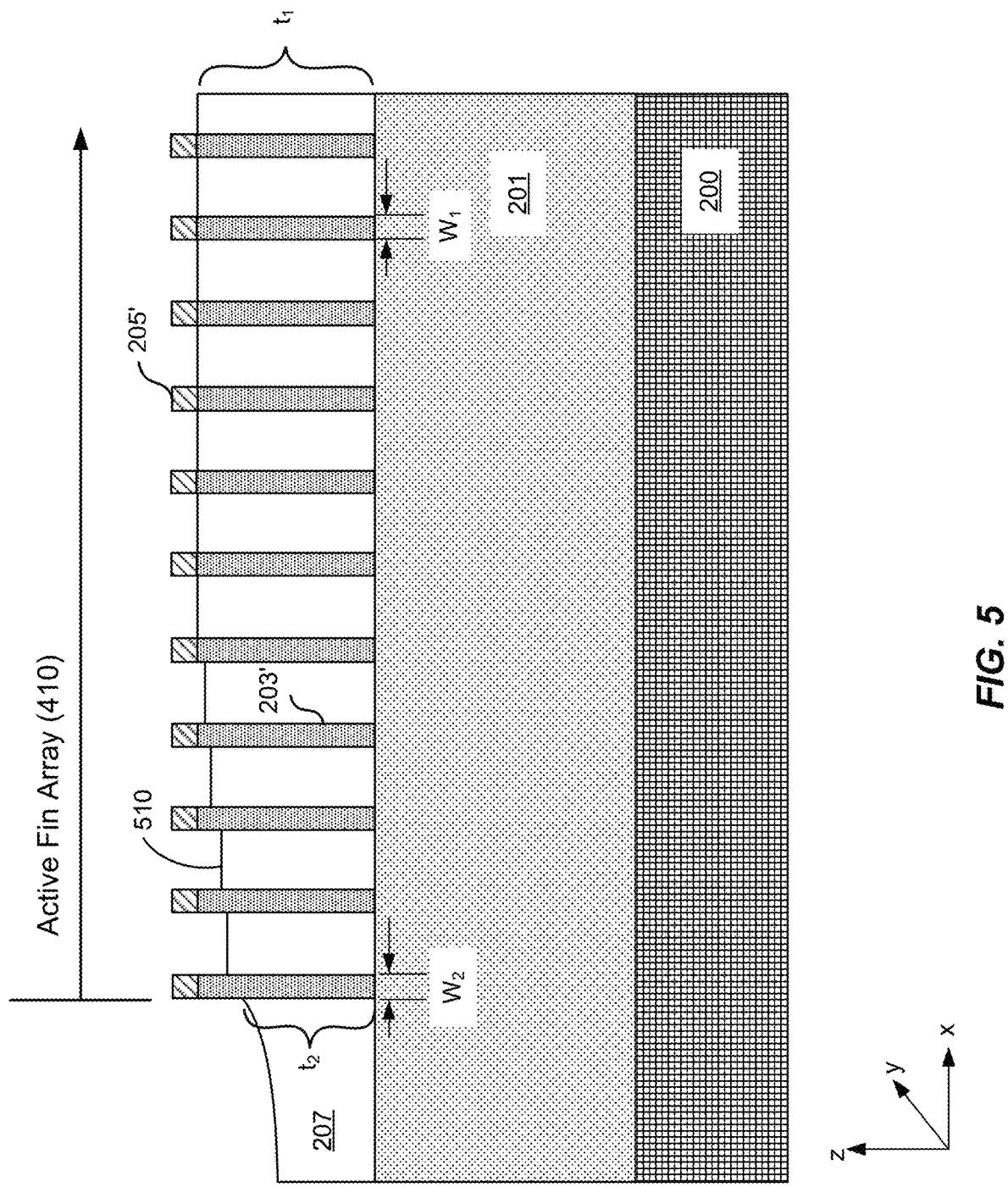
FIG. 5 shows a cross-section of an array of fins in an active fin array characterized by regrowth non-uniformity according to an embodiment of the present invention.

FIG. 5 shows a cross-section of an array of fins in an active fin array characterized by regrowth non-uniformity according to an embodiment of the present invention. In FIG. 5, the cross-section is taken along direction A-A' shown in FIG. 4A. As illustrated in FIG. 5, elements discussed in relation to FIGS. 2A-2D are shown, including n-type III-nitride substrate 200, first n-type semiconductor layer 201, fins 203' formed from second N-type semiconductor layer 203 illustrated in FIG. 2A, and fourth semiconductor layer 207, i.e., the regrown p-type GaN layer serving as the gate. Source contacts 205' are illustrated. A number of non-uniformities in the fin array due to edge effects can be present in the cross-section illustrated in FIG. 5, including irregular or incomplete p-GaN gate growth, irregular p-GaN gate dopant incorporation, and variation in fin dimensions.

Referring to FIG. 5, the thickness of the fourth semiconductor layer 207, also referred to as the regrown p-GaN gate, varies as a function of lateral dimension (i.e., along the x-direction) due to edge effects at the edge of the fin array. The thickness varies from thickness $t_1$ at portions of the fin array adjacent the center of the fin array to thickness $t_2$ at the edge of the fin array. Although the decrease in thickness is illustrated as step 510, it will be appreciated that FIG. 5 is merely a schematic diagram and the thickness variation can be present in other morphologies. In some embodiments, as illustrated in FIG. 5, the regrowth thickness decreases near the edge of the fin array, for example, resulting in a concave regrowth surface, with the thinnest portion of the regrowth positioned between adjacent fins. In other embodiments, the regrowth thickness increases near the edge of the fin array, resulting in overgrowth to thicknesses higher than the fin thickness. Although it is not illustrated in FIG. 5, variation in gate trench depth can also be present.

In addition to regrowth thickness non-uniformity, the regrown material may also be characterized by variation in doping concentration. Because regrowth rates are different on different planes of the GaN hexagonal crystal, for example, the m-planes and the c-planes, the dopant incorporation can vary depending on the growth plane.

Moreover, in addition to regrowth thickness, the fin width can vary as a function of lateral dimension (i.e., along the x-direction). As illustrated, in FIG. 1, the fin width, which, as discussed above, is defined, in part, by the dimension of the mask used to etch the gate trenches, varies from width $W_1$ adjacent the center of the fin array to width $W_2$ at the edge of the fin array. Although a decrease in fin width is illustrated in FIG. 5, it will be appreciated that the fin width variation can be present in other manners. In some embodiments, as illustrated in FIG. 5, the fin width decreases near the edge of the fin array, whereas, in other embodiments, the fin width increases near the edge of the fin array.

Figure 6:
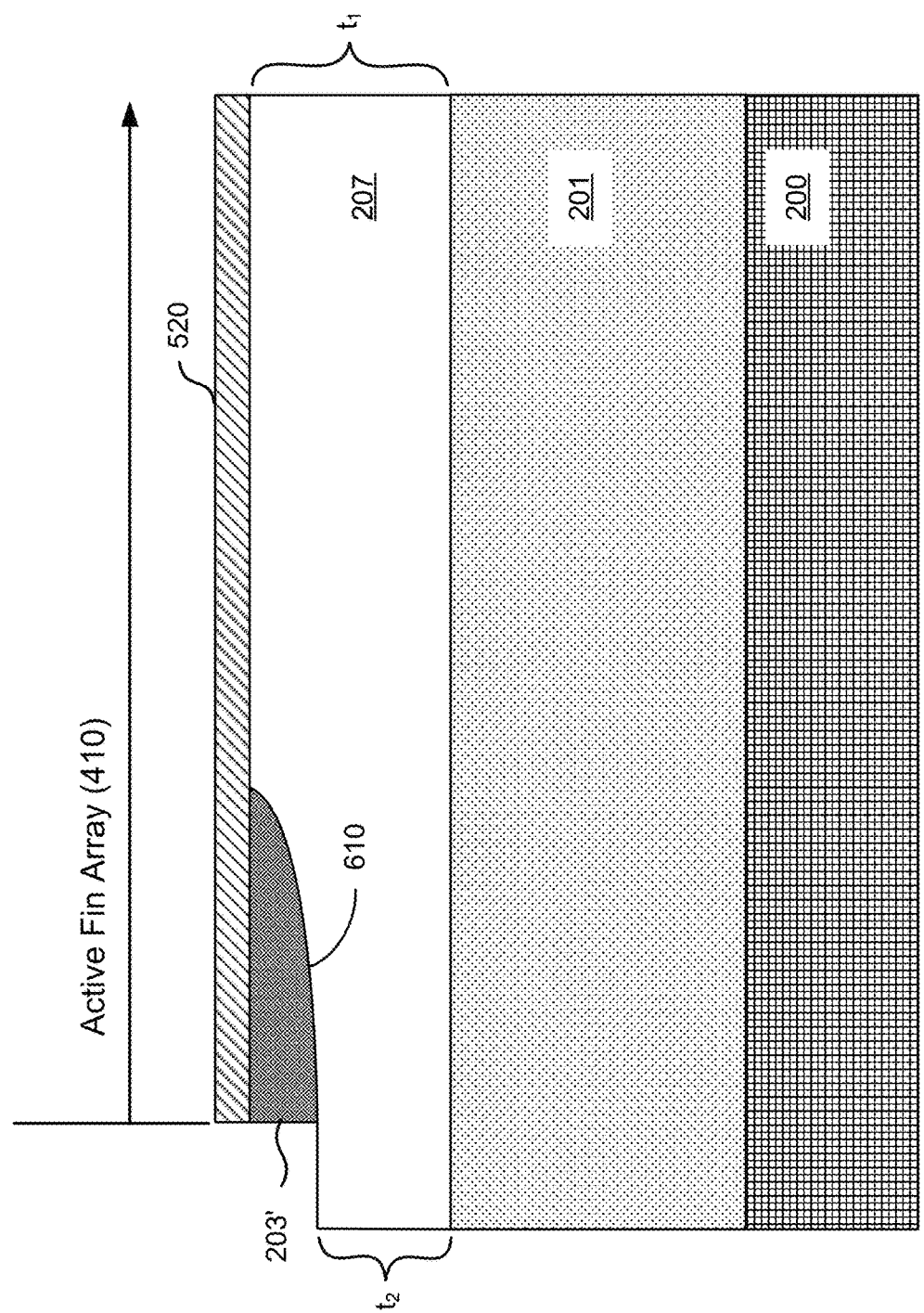
FIG. 6 shows a cross-section of a fin in an active fin array characterized by regrowth non-uniformity according to an embodiment of the present invention.

FIG. 6 shows a cross-section of a fin in an active fin array characterized by regrowth non-uniformity according to an embodiment of the present invention. In FIG. 6, the cross-section is taken along direction B-B' shown in FIG. 4A. FIG. 6 shares common elements with FIG. 5 and the description provided in relation to FIG. 5 is applicable to FIG. 6 as appropriate. Although multiple non-uniformities can be present in relation to the fin illustrated in FIG. 6, the discussion herein focuses on regrowth non-uniformity.

Referring to FIG. 6, the thickness of the fourth semiconductor layer 207, also referred to as the regrown p-type GaN gate, varies as a function of lateral dimension (i.e., along the x-direction) due to edge effects at the edge of the fin array. The thickness decreases from thickness $t_1$ at portions of the fin adjacent the center of the fin array to thickness $t_2$ at the end of the fin. In FIG. 6, the decrease in thickness is illustrated as curve 610, but it will be appreciated that FIG. 6 is merely a schematic diagram and the thickness variation can be present in other morphologies. In some embodiments, as illustrated in FIG. 6, the regrowth thickness decreases near the end of the fin, but in other embodiments, the regrowth thickness increases near the end of the fin, resulting in overgrowth to thicknesses higher than the fin thickness. Although they are not illustrated in FIG. 6, variation in gate trench depth, variation in doping concentration, and variation in fin width can also be present.

Figure 7:
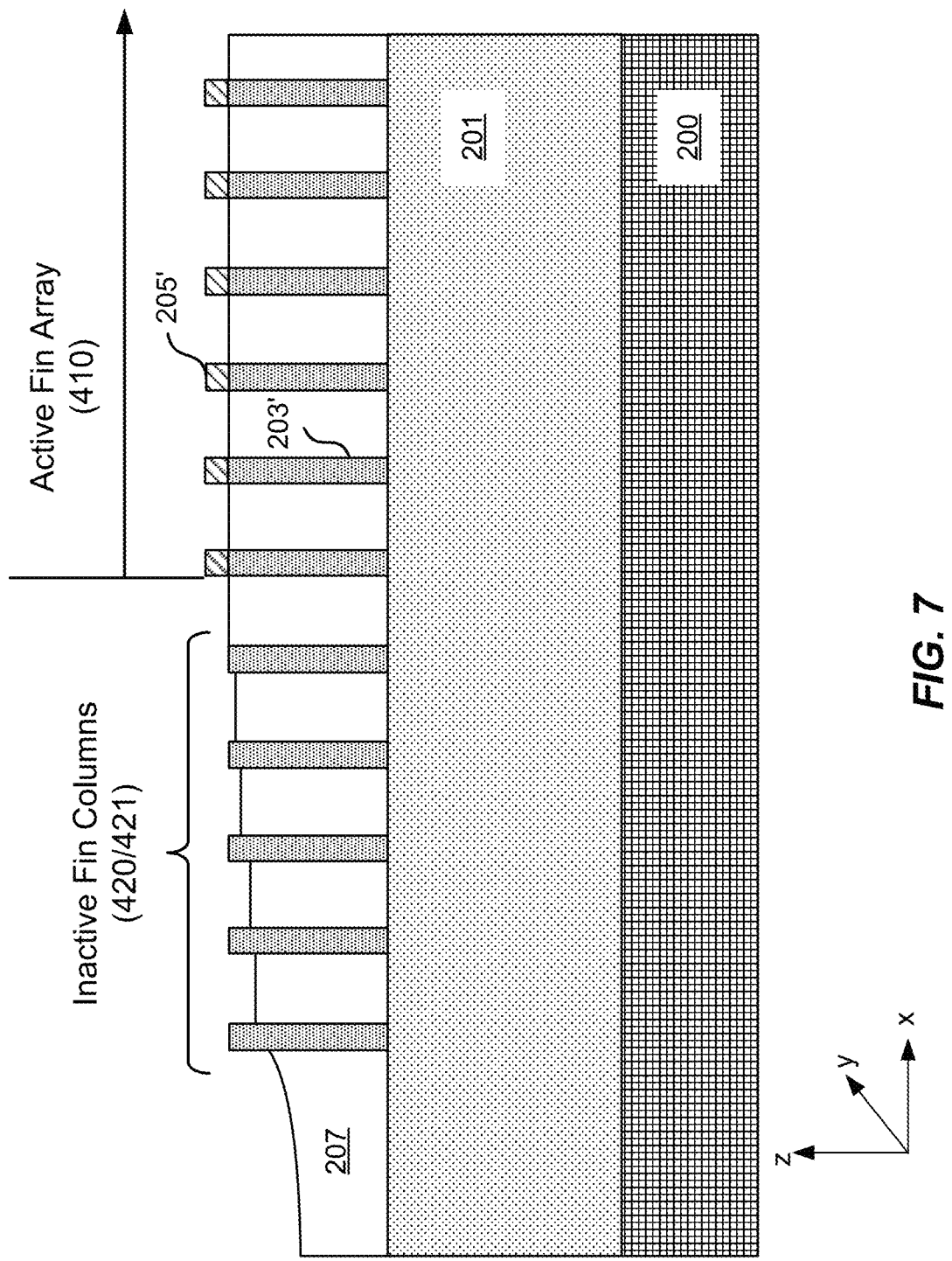
FIG. 7 shows a cross-section of an array of fins in an active fin array and inactive fin columns according to an embodiment of the present invention.

FIG. 7 shows a cross-section of an array of fins in an active fin array and inactive fin columns according to an embodiment of the present invention. In FIG. 7, the cross-section is taken along direction A-A' shown in FIG. 4A. As discussed in relation to FIG. 5, near the end of the array of fins, in this example, in the area of the inactive fin columns 420, the thickness of the fourth semiconductor layer 207, also referred to as the regrown p-GaN gate, varies as a function of lateral dimension (i.e., along the x-direction) due to edge effects at the edge of the fin array. In addition to regrowth thickness non-uniformity, the other non-uniformities discussed above, including fin width variation and non-uniform dopant incorporation, may also be present. As illustrated in FIG. 7, the regrowth non-uniformity is present in the inactive fin columns 420, but not in the active fin array 410, which is characterized by uniform regrowth. Thus, in this embodiment, the regrowth non-uniformity, as well as the other non-uniformities discussed herein, is limited to the columns of inactive fins, which do not contribute to current flow though the FET device.

It should be noted that the source contacts 520 are only formed on fins in the active fin array 410 and not on the fins in the inactive fin columns 420 since the inactive fins do not contribute to current flow through the FET device. It should be noted that the source contacts 205' are shown in FIGS. 5 and 7 merely to illustrate the location of the fin surface, since the source contacts can be positioned behind the plane of the cross-section, in a manner similar to the positioning of the fins in some embodiments.

Figure 8:
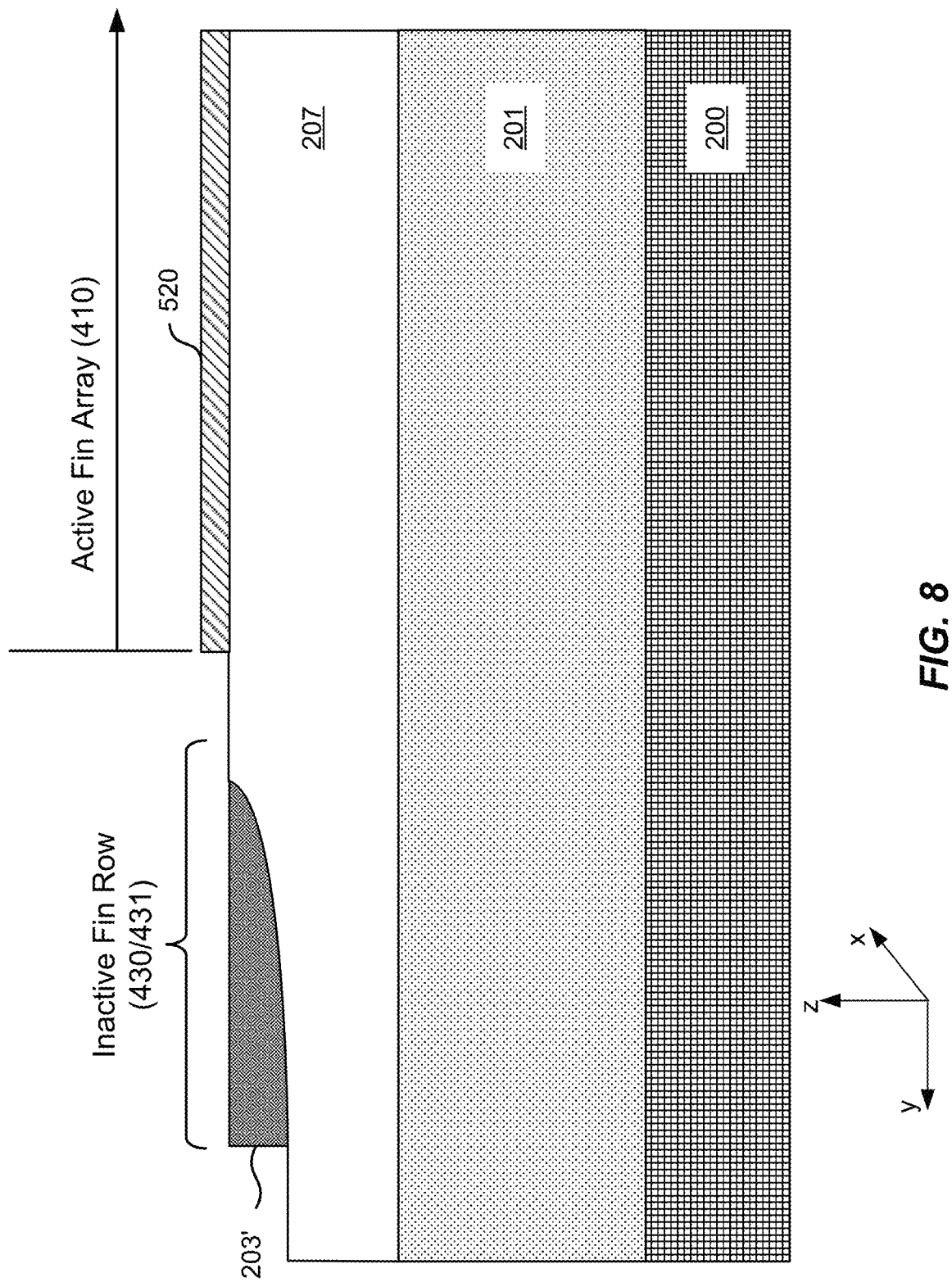
FIG. 8 shows a cross-section of a fin in an active fin array and an inactive fin row according to an embodiment of the present invention.

FIG. 8 shows a cross-section of a fin in an active fin array and an inactive fin row according to an embodiment of the present invention. In FIG. 8, the cross-section is taken along direction B-B' shown in FIG. 4A. FIG. 8 share common elements with FIG. 7 and the description provided in relation to FIG. 7 is applicable to FIG. 8 as appropriate. Although multiple non-uniformities can be present in relation to the inactive fin illustrated in FIG. 8, the discussion herein focuses on regrowth non-uniformity.

Referring to FIG. 8, the thickness of the fourth semiconductor layer 207, also referred to as the regrown p-GaN gate, varies as a function of lateral dimension (i.e., along the y-direction) due to edge effects at the edge of the fin array. As discussed in relation to FIG. 7, near the end of the array of fins, in this example, in the area of the inactive fin row 430, the thickness of the fourth semiconductor layer 207, also referred to as the regrown p-GaN gate, varies as a function of lateral dimension (i.e., along the y-direction) due to edge effects at the edge of the fin array. In addition to regrowth thickness non-uniformity, the other non-uniformities discussed above, including fin width variation and non-uniform dopant incorporation, may also be present. As illustrated in FIG. 8, the regrowth non-uniformity is present in the inactive fin row 430, but not in the active fin array 410, which is characterized by uniform regrowth. Thus, in this embodiment, the regrowth non-uniformity, as well as the other non-uniformities discussed herein, is limited to the columns of inactive fins, which do not contribute to current flow through the FET device.

Figure 9:
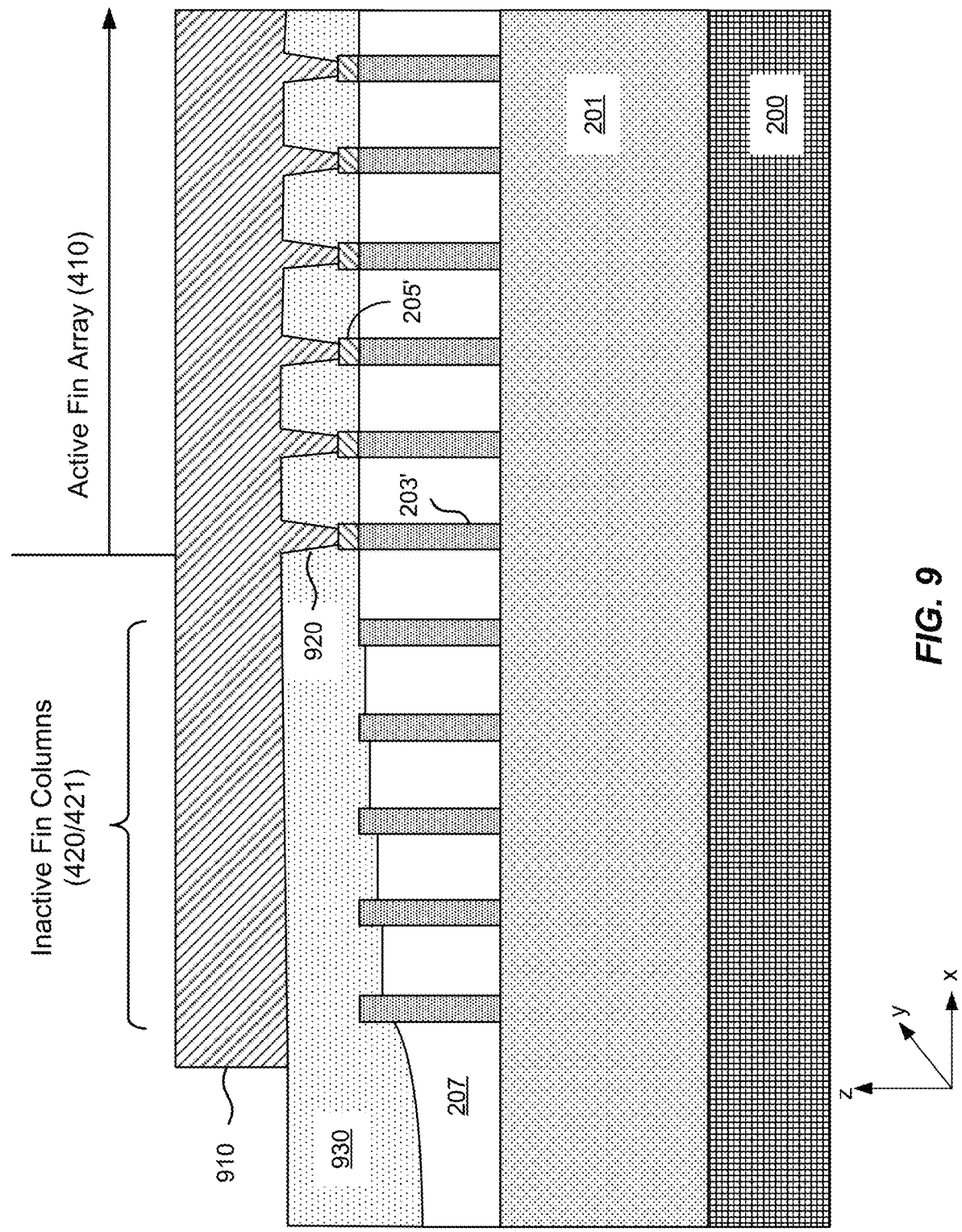
FIG. 9 shows a cross-section of an array of fins in an active fin array and inactive fin columns with a source pad metal according to an embodiment of the present invention.

FIG. 9 shows a cross-section of an array of fins in an active fin array and inactive fin columns with a source pad metal according to an embodiment of the present invention. In FIG. 9, the cross-section is taken along direction A-A' shown in FIG. 4A. As illustrated in FIG. 9, electrical connection between the source pad metal 910 and source contacts 205' is provided through vias 920 passing through dielectric layer 930. No vias are present between the source pad metal 910 and the inactive fins in the inactive fin columns 420/421. In this embodiment, the source contact metal forming source contacts 205' is not present on the inactive fins in a manner similar to that shown in FIGS. 7 and 8. In other embodiments, the source contact metal is present on the inactive fins but the lack of vias and the presence of the dielectric layer prevents the inactive fins from being electrically active. Although the inactive fins do not contribute to current flow in the FET device, they provide a region of predetermined dimensions between the active fin array and the area surrounding the active fin array, thereby resulting in uniform regrowth in the active fin array.

Embodiments of the present invention are applicable to arrays of fin-based vertical FETs in which the current runs vertically along the fin and the arrays of fins are enclosed by a gate-all-around structure so that all fins have a common gate. The gate-channel interface can be located on the vertical sidewall of the vertical fin. The FETs may be JFETs with regrown gates, implanted gates, or diffused gates, or they may be MOSFETs, including accumulation-mode MOSFETs. The fin-based vertical FETs can be fabricated using III-nitride semiconductors. In an embodiment, the fin-based vertical FETs are fabricated using GaN. In an embodiment, the number of inactive fin columns is between 1 and 10, and the number of inactive fin rows is between 1 and 5. In an embodiment, the inactive fin rows use fins of shorter height (as discussed in relation to FIG. 4B) than the active fins in the active fin array. In an embodiment, the inactive fin row height is comparable to the width of the region encompassed by the inactive fin columns. Additional description related to implanted gates and diffused gates is provided in commonly assigned U.S. patent application Ser. No. 17/667,432, filed on Feb. 8, 2022, the disclosure of which is hereby incorporated by reference in its entirety for all purposes.

Figure 10:
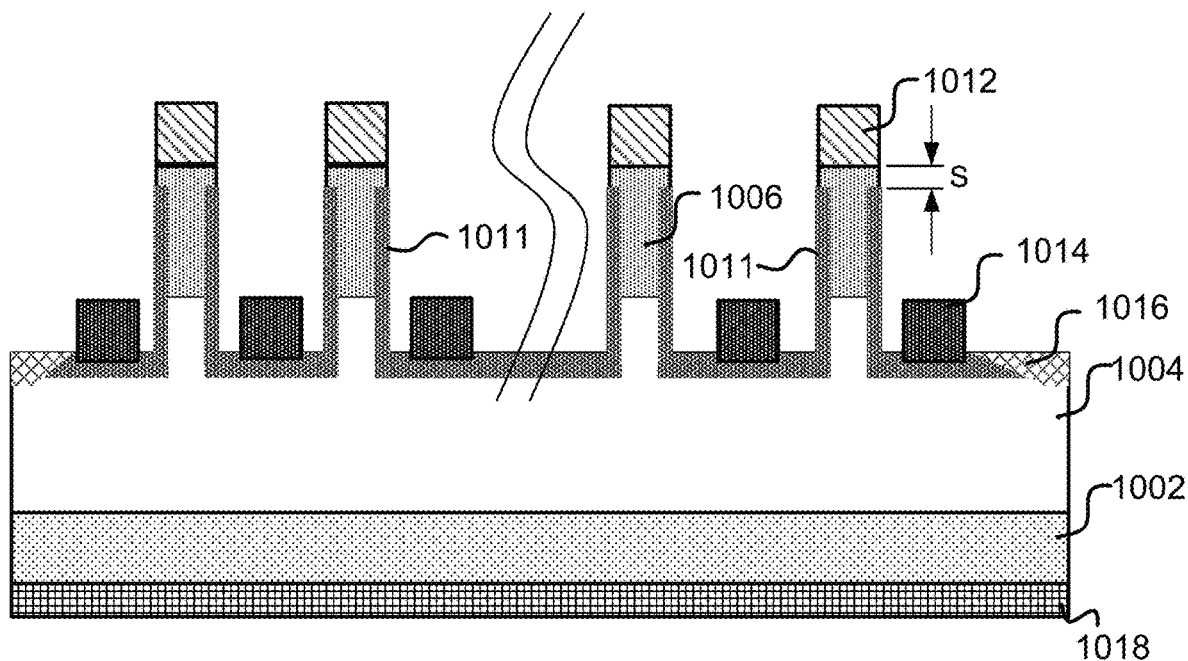
FIG. 10 is a cross-section view of an alternative vertical, fin-based gate-all-around JFET device using implanted or diffused gates according to an embodiment of the present invention.

FIG. 10 is a cross-section view of an alternative vertical, fin-based gate-all-around JFET device using implanted or diffused gates according to an embodiment of the present invention. In the alternative embodiment illustrated in FIG. 10, the regrown gate structure illustrated in FIG. 2D has been replaced with implanted or diffused gates. Although only a portion of the JFET device is illustrated in FIG. 10, it will be appreciated that the illustrated structure can be implemented as a portion of an active fin array in conjunction with inactive fin columns and one or more inactive fin rows as described more fully herein. The use of the inactive fin columns and one or more inactive fin rows enables the formation of uniform fins as described herein.

In FIG. 10, a source metal contact structure 1012 is formed on an upper portion of a second III-nitride layer 1006, which is coupled to a first III-nitride layer 1004. Thus, source metal contact structure 1012 is formed on the fins. Source metal contact structure 1012 is electrically isolated from the semiconductor gate region 1011. In FIG. 10, semiconductor gate region 1011 extends along the sidewall of the fin and a physical separation S between semiconductor gate region 1011 and source metal contact structure 1012 can be utilized to provide electrical isolation. In some embodiments, the source metal contact structure 1012 forms a self-aligned contact to the upper portion of second III-nitride layer 1006. In some embodiments, the source metal contact structure 1012 includes a hard mask metal layer. The source metal contact structure 1012 may include titanium, aluminum, titanium nitride, combinations thereof, or the like.

Gate metal contact structure 1014 is formed on the upper portion of semiconductor gate region 1011. In some embodiments, the gate metal contact structure 1014 can include a metallic structure. For example, the metallic structure may include nickel, palladium, silver, gold, combinations thereof, and the like. The metallic structure can make an ohmic contact with the semiconductor gate region 1011, which can be a p-type semiconductor gate region. An edge termination 1016 is formed on the p-type layer used as the semiconductor gate region 1011 to enable high-voltage operation of the device. The p-type layer may also be connected to the source in some embodiments. A drain metal contact structure 1018 is formed on a second side, i.e., the backside, of III-nitride substrate 1002. The drain metal contact structure 1018 can form an ohmic contact to the III-nitride substrate 1002. In some embodiments, the drain metal contact structure 1018 can include titanium, aluminum, or combinations thereof. In some embodiments, the drain metal contact structure 1018 can further include a solderable metal structure such as silver, lead, tin, combinations thereof, or the like.

The semiconductor gate region 1011 can be a diffused gate structure in which a diffusion source is utilized in a process in which diffusion dopants are incorporated into second III-nitride layer 1006 and first III-nitride layer 1004. As an example, a layer of a diffusion dopant material may be applied to the surfaces of the fins and first III-nitride layer 1004. In some embodiments, the layer of diffusion dopant material may include either a metal layer formed with a p-type dopant (e.g., Mg, Zn, combinations thereof, and the like) or a metallic oxide layer formed with a p-type dopant (e.g., MgO, ZnO, combinations thereof, and the like), in contact with the exposed III-nitride surfaces of the fins. In some embodiments, the thickness of the metal or metallic oxide layer is 50-100 nm. In some embodiments, the layer of diffusion dopant material may further include a second layer of dielectric material (e.g., $SiO_2$, $Si_3N_4$ or the like) disposed on the metal or metallic oxide layer.

A thermal treatment can be used to diffuse the p-type dopant into the exposed surfaces of the first III-nitride layer 1004 and the second III-nitride layer 1006. The resulting channel can have a width of the fin width minus twice the diffusion depth. In some embodiments, the thermal treatment may be performed in a furnace at temperatures from 900° C. to 1100° C. In some embodiments, the thermal treatment may be performed in a rapid thermal annealer at temperatures from 1000° C. to 1450° C. In some embodiments the thermal treatment may be performed at a high ambient pressure (e.g., at 1 GPa in a $N_2$ ambient), with or without the protective layer. In some embodiments, the heating may be a result of a series of rapid pulses (e.g. microwave). After diffusion, the diffusion dopant material may be removed, for example, by using a wet etch.

In other embodiments, rather than diffusion, ion implantation is utilized to form implanted gate regions. Accordingly, the discussion provided in relation to FIG. 10 with respect to diffusion doping can be applied in the context of ion implantation and annealing to form implanted gate regions. One of ordinary skill in the art would recognize many variations, modifications, and alternatives.

Figure 11:
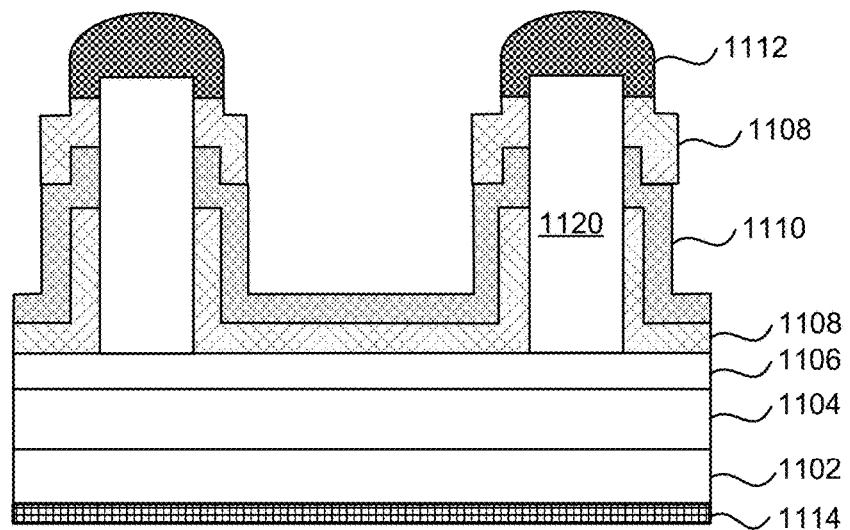
FIG. 11 is a cross-section view of an alternative vertical, fin-based gate-all-around MOSFET device according to an embodiment of the present invention.

FIG. 11 is a cross-section view of an alternative vertical, fin-based gate-all-around MOSFET device according to an embodiment of the present invention. The alternative embodiment illustrated in FIG. 11 illustrates two active fins that can be implemented as a portion of an active fin array in conjunction with inactive fin columns and one or more inactive fin rows as described more fully herein. The use of the inactive fin columns and one or more inactive fin rows enables the formation of uniform fins as described herein. Referring to FIG. 11, substrate 1102, for example, an n-type GaN substrate, supports drift layer 1104 and graded layer 1106. Fins 1120 are formed in contact with graded layer 1106. Source contact 1112 is electrically connected to fin 1120 and a channel region is operated in conjunction with gate 1110, which is electrically isolated by dielectric 1108. During operation of this accumulation mode MOSFET, in response to gate bias, vertical current flow from source contact 1112 to drain contact 1114 passes through fins 1120.

Thus, in a manner similar to that discussed with respect to the JFET device discussed in relation to FIG. 10, the MOSFET device illustrated in FIG. 11 can use the inactive fin columns and one or more inactive fin rows to form uniform fins as described herein.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known", and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to", or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A vertical, fin-based field effect transistor (FinFET) device comprising:
    an array of individual FinFET cells, the array comprising a plurality of rows and columns of separated fins, wherein each of the separated fins is in electrical communication with a source contact;
    one or more rows of first inactive fins disposed on a first set of sides of the array of individual FinFET cells;
    one or more columns of second inactive fins disposed on a second set of sides of the array of individual FinFET cells; and
    a gate region surrounding the individual FinFET cells of the array of individual FinFET cells, the first inactive fins, and the second inactive fins.

2. The FinFET device of claim 1 wherein a height of the first inactive fins is less than a height of the separated fins in the array of individual FinFET cells.

3. The FinFET device of claim 1 wherein the first inactive fins and the second inactive fins do not have associated source contacts.

4. The FinFET device of claim 1 wherein the individual FinFET cells comprise regrown gate FinFETs.

5. The FinFET device of claim 1 wherein the individual FinFET cells comprise diffused gate FinFETs.

6. The FinFET device of claim 1 wherein the individual FinFET cells comprise implanted gate FinFETs.

7. The FinFET device of claim 1 wherein the individual FinFET cells comprise MOSFETs.

8. The FinFET device of claim 1 wherein:
the FinFET device includes a plurality of source contacts and a plurality of channels;
the gate region comprises a common gate; and
the individual FinFET cells have a common drain.

9. The FinFET device of claim 1 wherein the one or more rows of first inactive fins comprises between one row and ten rows per side.

10. The FinFET device of claim 9 wherein the one or more rows of first inactive fins comprises one row per side.

11. The FinFET device of claim 1 wherein the one or more columns of second inactive fins comprise between one and ten columns per side.

12. The FinFET device of claim 11 wherein the one or more columns of second inactive fins comprise five columns per side.

\* \* \* \* \*